United States Patent [19]

Fujii et al.

[11] Patent Number: 4,896,055

[45] Date of Patent: Jan. 23, 1990

[54] SEMICONDUCTOR INTEGRATED CIRCUIT TECHNOLOGY FOR ELIMINATING CIRCUITS OR ARRAYS HAVING ABNORMAL OPERATING CHARACTERISTICS

[75] Inventors: Syuso Fujii, Kawasaki; Shozo Saito, Yokohama, both of Japan

[73] Assignee: Kabushiki Kaisha Toshiba, Kanagawa, Japan

[21] Appl. No.: 164,407

[22] Filed: Mar. 4, 1988

[30] Foreign Application Priority Data

Mar. 6, 1987 [JP] Japan .................. 62-51362

[51] Int. Cl.$^4$ .................. G06F 15/60; G11C 7/00; G01R 31/28; H03K 19/007
[52] U.S. Cl. .................. 307/442; 307/296.1; 307/482.1; 307/468; 371/25.1; 371/26; 371/14; 371/22.2; 364/551.01; 365/201; 324/73.1
[58] Field of Search .................. 307/22.1, 219, 296 R, 307/468, 469, 465, 297, 441, 442, 482.1, 303.2; 371/8, 9, 10, 14, 21, 22, 24, 25, 26, 72; 365/227, 201; 364/551; 324/73 R, 73 AT

[56] References Cited

U.S. PATENT DOCUMENTS

| 4,635,259 | 1/1987 | Schinabeck et al. | 371/25 X |
| 4,635,261 | 1/1987 | Anderson et al. | 371/25 |
| 4,680,761 | 7/1987 | Burkness | 371/25 |
| 4,703,436 | 10/1987 | Varshney | 365/201 X |
| 4,710,704 | 12/1987 | Ando | 324/73 R |
| 4,710,931 | 12/1987 | Bellay et al. | 324/73 R X |
| 4,739,250 | 4/1988 | Tanizawa | 324/73 R |
| 4,752,729 | 6/1988 | Jackson et al. | 324/73 R |
| 4,780,627 | 10/1988 | Illman | 307/465 |
| 4,780,628 | 10/1988 | Illman | 307/465 |

Primary Examiner—Stanley D. Miller
Assistant Examiner—David R. Bertelson
Attorney, Agent, or Firm—Banner, Birch, McKie & Beckett

[57] ABSTRACT

In a semiconductor integrated circuit, power lines or ground lines of a plurality of circuit blocks having equivalent functions are coupled via a switch circuit to a common main power line or main ground line on a semiconductor integrated circuit chip or semiconductor wafer. The main power line is supplied with power source potential and said main ground line with ground potential. A switch control circuit selectively switches the switch circuit ON or OFF so that defective circuit blocks may be deactivated.

26 Claims, 7 Drawing Sheets

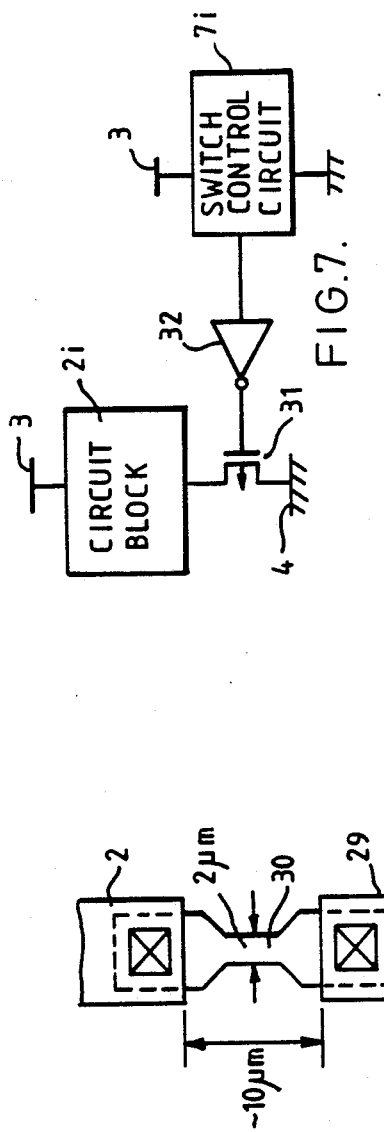
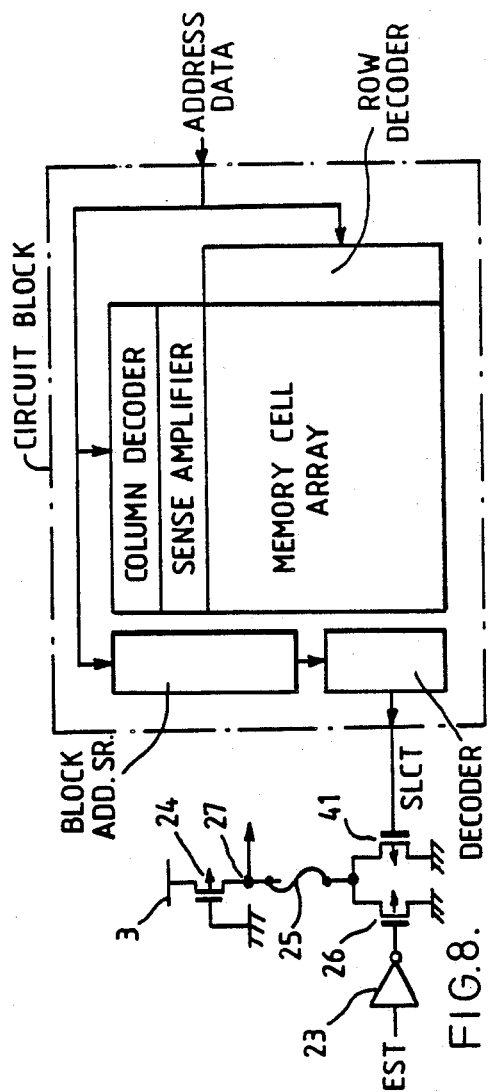

SEMICONDUCTOR INTEGRATED CIRCUIT TECHNOLOGY FOR ELIMINATING CIRCUITS OR ARRAYS HAVING ABNORMAL OPERATING CHARACTERISTICS

BACKGROUND OF THE INVENTION (1) Field of the Invention

This invention generally relates to semiconductor integrated circuits (ICs). In particular, it relates to a chip recovery circuit which is formed on an integrated circuit chip or on a semiconductor wafer provided with a plurality of functionally equivalent circuit blocks. The recovery circuit makes chip recovery possible by deactivating any circuit block in which abnormal operating characteristics are detected. The remaining circuit blocks may then be used.

(2) Description of the Prior Art

In order to deal with defective memory cells in a memory cell array, the redundancy technique has been used in the semiconductor field. In this technique, the memory is provided with spare memory cells which may be used in place of defective cells. In a memory array, spare rows and columns may be provided to replace defective rows and columns. However, the inclusion of additional cells increases production costs. It is also difficult to exchange these spare cells for the defective cells. Extra controls must be provided to effect such exchanges and this complicates the overall circuitry.

Logic ICs and similar devices are often provided with several circuit blocks which are functionally equivalent and virtually independent of one another. Types of circuit blocks may include shift registers, memory cell arrays, or gate arrays. Usually a power line, a ground line, and several input/output signal lines are coupled to each circuit block. in an integrated circuit of this type, an improperly functioning circuit block should not be used or should not be selected during use. However, in the prior art integrated circuit shown in FIG. 1, the power lines and ground lines of the circuit blocks $8_1$ to $8_n$ are coupled to main power line 81 and main ground line 82 on the chip. If a power current abnormality occurs in even a single circuit block, the current becomes abnormal throughout the whole chip. Thus, the remaining circuit blocks may not used, even though they may be operating normally. One remedy is to isolate the faulty block from main line 81 or 82. However, problems arise in attempting to disconnect the power line, which is usually relative wide. If, as shown in FIG. 2, a main power line 91, consisting of a metal wire, and a power line 92, consisting of a metal wire in the circuit block, are separated by a gap of about 10 microns, a polysilicon film 93 may be used to make the connection between wires 91 and 92. Such a film must be relatively wide (up to 100 microns) in order to make the coupling resistance between wires 91 and 92 no greater than several ohms. One method of cutting polysilicon film 93 to disconnect the power line would be to directly irradiate it with a scanning laser beam. But because of the film's width, such a process would take a relatively long time and greatly reduce the production rate. In addition, a considerable amount of heat would be generated and could damage both the semiconductor substrate and main power line 91, further impairing reliability. These problems prevent the use of laser beam irradiation to cut such a film. In addition, it is extremely difficult to identify a block with abnormal operating characteristics. The identification is relatively simple if the current abnormality occurs for the first time at the onset of a specific operating mode, i.e. during selection of a particular circuit block. But if the abnormality occurs during all operating modes, such identification is not possible. As a result, chip recovery is impossible.

SUMMARY OF THE INVENTION

Accordingly, an object of this invention is to provide a semiconductor integrated circuit including a plurality of circuit blocks having equivalent functions with improved yield.

Another object of this invention is to provide a semiconductor integrated circuit in which a circuit block with abnormal operating characteristics may be readily identified.

According to this invention, a semiconductor integrated circuit comprises a plurality of circuit blocks, each having equivalent functions. A switch means corresponds to each circuit block for coupling power from a power line to the corresponding circuit block. A switch control means corresponds to each switch means for selectively controlling the activation of the corresponding switch means.

BRIEF DESCRIPTION OF THE DRAWINGS

A more complete appreciation of the invention and many of the attendant advantages thereof will be readily obtained as the invention becomes better understood by reference to the following detailed description when considered in connection with the accompanying drawings, wherein:

FIG. 6 is a plan pattern view of the fuse in FIG. 4.

FIG. 7 is a circuit diagram of the switch circuit and switch control circuit in another embodiment.

FIGS. 8 and 10 are circuit diagrams of the switch control circuits of another embodiment.

DESCRIPTION OF THE PREFERRED EMBODIMENTS

Figure 1:
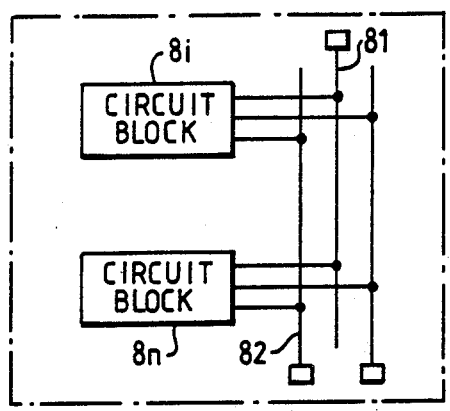
FIG. 1 is a block diagram of a conventional semiconductor integrated circuit.
Figure 2:
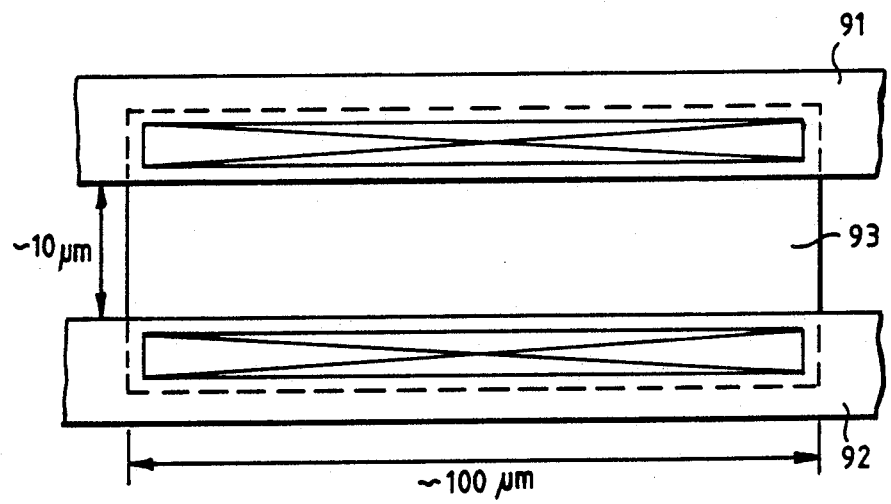
FIG. 2 is a plan pattern showing a polysilicon film provided between the circuit block of FIG. 1 and the main power line.
Figure 3:
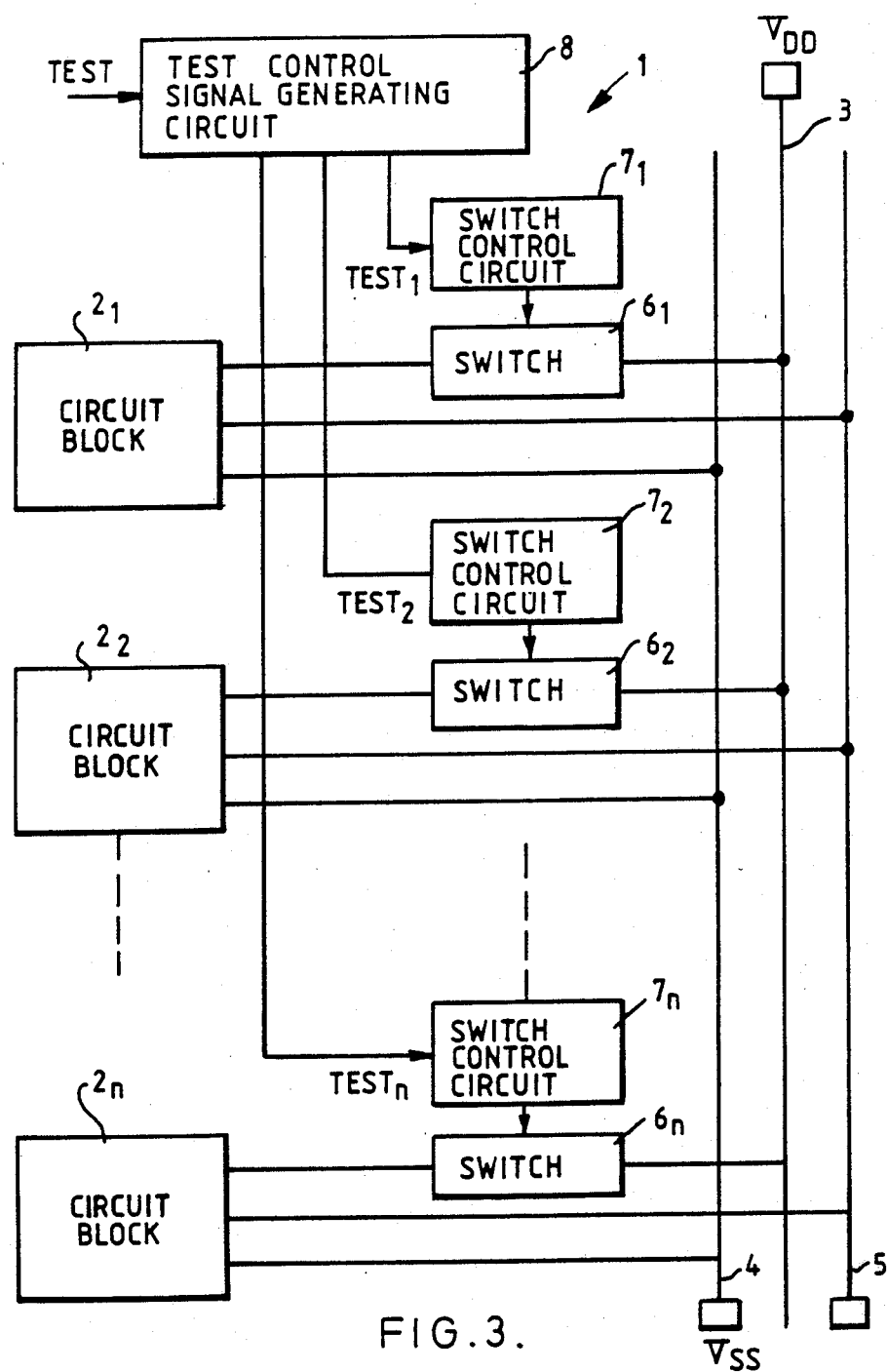
FIG. 3 is a block diagram of an embodiment of the semiconductor integrated circuit of the present invention.

FIG. 3 shows a portion of a Large Scale Integrated (LSI) chip 1. $2_1$ to $2_n$ denote functionally equivalent circuit blocks which are virtually independent of one another. Types of circuit blocks may include shift registers, memory cell arrays, or gate arrays. Main power line 3 and main ground line 4 are provided on LSI chip 1 to supply power to the circuit blocks. The main input-/output lines 5 are shown as one line in order to simplify the drawing. The input/output lines of each block $2_1$ to $2_n$ are coupled to main input/output lines 5. The power and ground lines of each block are coupled to main power line 3 and main ground line 4, respectively. Switch circuits $6_1$ to 6HD n coupler power from the power line to the corresponding circuit block. Although FIG. 3 shows the switch circuits coupled to the main power line 3, they may also be coupled to main ground line 4 as will be discussed in more detail below. Switch control circuits $7_1$ to $7_n$ are provided for each switch circuit and selectively control the activation of the corresponding switch circuit. A test control signal generating circuit 8 generates a signal supplied to each circuit block for detecting abnormal operating characteristics.

A more detailed explanation will now be given with reference to FIG. 4 which shows a group of representative circuits, denoted by the subscript i, taken from circuit blocks $2_1$ to $2_n$, switch circuits $6_1$ to $6_n$, and switch control circuits $7_1$ to $7_n$. Circuit block $2_i$ may consist of a memory cell array but is not limited thereto. Switch circuit $6_i$ comprises a switching transistor (e.g. a P-type MOS transistor) connected in series between main power line 3 and the power line of circuit block $2_i$. Switch control circuit $7_i$ includes a resistance 24, a programmable element 25, and an N-type transistor 26 respectively connected in series between the main power line 3 and a ground. Programmable element 25 may be a fuse which can be blown by irradiation with a laser beam. Switch circuit $7_i$ also includes an inverter 23 to which test control signal $TEST_i$, produced by test control signal generating circuit 8, is input. The output terminal of inverter 23 is coupled to the gate of N-type transistor 26. A point between series-connected resistance 24 and fuse 25 (hereafter referred to as control output terminal 27) is coupled to the gate of switching transistor $6_i$. When a circuit block is to be selected, the test control signal for that circuit block, $TEST_i$, is made low level. If programmable element 25 is in an unprogrammed state, i.e., fuse 25 has not been blown, N-type transistor 26 is turned ON by the high level output of inverter 23, whose input terminal is coupled to the low level signal $TEST_i$. Control output terminal 27 becomes low and switching transistor $6_i$ is turned ON, supplying power to circuit block $2_i$ which enters its operating state. When test control signal $TEST_i$ is high, N-type transistor 26 turns OFF, control output terminal 27 becomes high, switching transistor $6_i$ turns OFF, and circuit block $2_i$ receives no power supply and therefore does not operate. Accordingly, only the circuit block to be tested receives power. If programmable element 25 is in a programmed state, i.e., fuse 25 has been blown, control output terminal 27 remains high level regardless of the logic level of test control signal $TEST_i$ and circuit block $2_i$ cannot operate. It is noted that inverter 23 may be omitted if the logic level of the test control signal input has been previously inverted. Resistance 24 in switch control circuit $7_i$ may be replaced by a normally ON MOS transistor.

Figure 5:
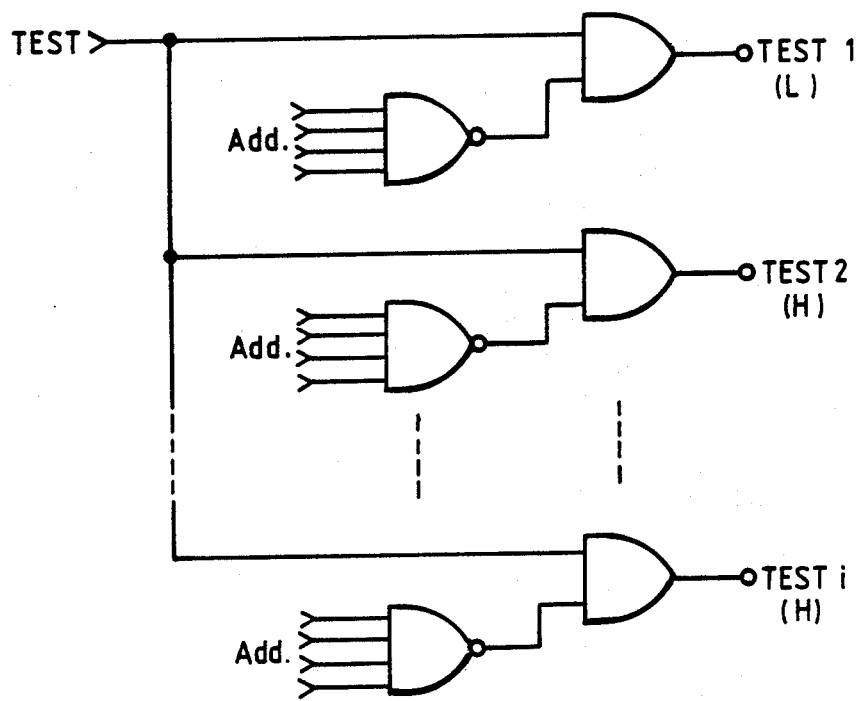
FIG. 5 is a circuit diagram of a test control signal generating circuit.

In the case of the LSI chip 1 describe above, each circuit block $2_1$ to 2HD n is selected in succession during die sorting in the course of manufacture. Succession as used herein may refer to any desired order or progression. Various tests are performed on the selected circuit block. When a block is found to have abnormal operating characteristics, fuse 25 of the corresponding switch control circuit 7 is blown by irradiation with a laser beam. Thus, the switch circuit 6 for the circuit block turns OFF, meaning that the other, properly functioning circuit blocks 2 may be recovered to provide a usable chip. In order to perform the above-described test, test control signal generating circuit 8 should be designed such that the test control signal $TEST_i$ for the selected circuit block is low and the test control signals $TEST_i$ for the remaining circuit blocks are all high. FIG. 5 shows one embodiment of test control signal generating circuit 8. With such an LSI chip, the coupling between each block and the main power line can be controlled and blocks with abnormal operating characteristics may be easily identified. All that is necessary to break the connection between a block with abnormal operating characteristics and the main power line is to blow fuse 25 of the corresponding switch control circuit 7. The technology of fuses and their disconnection is well known in many fields, including that of chip recovery by redundancy, and there is no adverse effect on mass production or reliability. If a polysilicon fuse about 10 microns long and approximately 2 microns wide is used and connected between metal wires 28 and 29, as shown for example, in FIG. 6, it can be blown by a short period of irradiation with a laser beam.

The invention is not limited to the above embodiments and other modified embodiments are also possible. For example, switch circuit $6_i$ may be inserted between the ground line of block $2_i$ and main ground line 4. As illustrated in FIG. 7, an N-type transistor 31 may be used as the switch circuit, and an inverter 32 inserted between the output terminal of switch control circuit $7_i$ and the gate of transistor 31.

Figure 9:
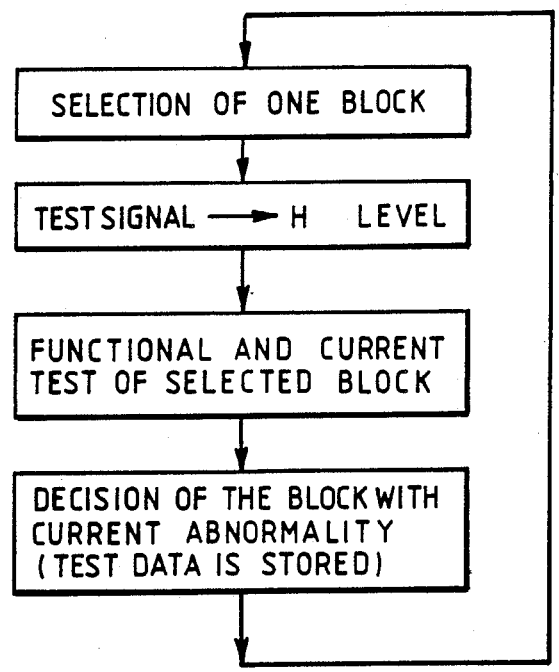
FIG. 9 is a flow chart of a method of testing the integrated circuit of FIGS. 8 and 10.

The signal level of control output terminal 27 may also be controlled by NORing a test control signal TEST common to each block with a block selection signal SLCT, as shown in FIG. 8. The control circuit of FIG. 8 consists of an N-type transistor 41 whose gate is suppled with block selection signal SLCT. Transistor 41 is connected in parallel with N-type transistor 26 of switch control circuit $7_i$ shown in FIG. 4. Load resistance 24 has been replaced by a normally ON P-type transistor with its gate grounded. A test control signal (TEST) common to all blocks is used in place of test control signal $TEST_i$ for each block. Address data is used to select a circuit block. The block selection signal SLCT becomes high level for the selected block and low level for the remaining unselected blocks. The flow chart of FIG. 9 illustrates a method of testing each circuit block in succession when a comon test control signal is used. First a single block is addressed and the corresponding selection signal SLCT becomes high. Then, the test control signal TEST is made high. N-type MOS transistor 41 of the selected circuit block is turned ON by block selection signal SLCT and N-type MOS transistor 26 is turned off by the output signal of inverter circuit 23. Therefore, control output terminal 27 becomes low, and power is supplied to the addressed block. During testing, fuse 25 is in its unprogrammed state. The selected block is subjected to various tests, a decision is made as to whether it shows abnormal operating characteristics, and the decision data is stored. Then, test control signal TEST is made low, the N-type transistor 26 in each switch control circuit is turned ON, control output terminals 27 become low level, and the initial state is recaptured, with power being supplied to all blocks. Next, the above-described operation is repeated with a different circuit block being addressed, selected and tested, until every circuit block has been tested. To turn off the switching transistor of a circuit block found to have abnormal operating characteristics, fuse 25 in the corresponding switch control circuit is blown.

Figure 10:
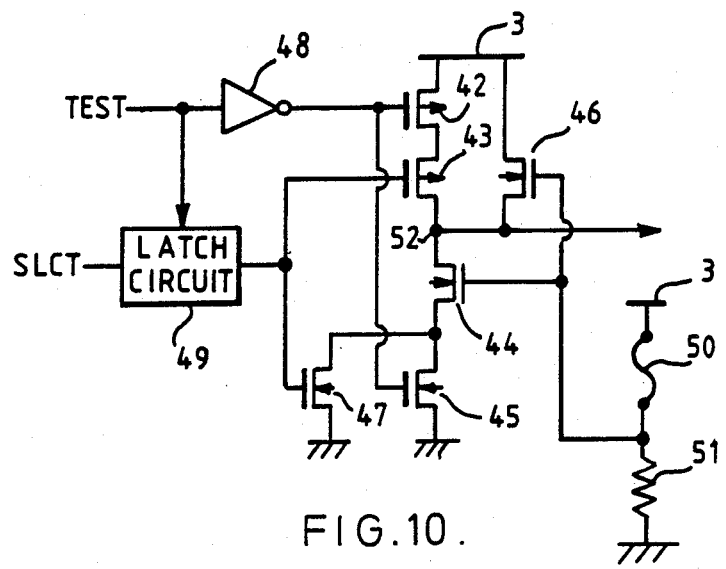

FIG. 10 shows another embodiment of a switch control circuit which NORs the inverted phase signal of common test control signal TEST with the block selection signal SLCT, and speeds up the rise of the output of control output terminal 52 by NANDing this NOR output with the output of the fuse circuit. Specifically, P-type transistors 42 and 43 and N-type transistors 44 and 45 are coupled in series between main power line 3 and a ground terminal. A P-type transistor 46 is coupled between the point of connection (hereafter referred to as control output terminal 52) of transistors 43 and 44 and main power line 3. An N-type transistor 47 is coupled in parallel with transistor 45. Incverter 48 inverts the test control signal TEST and its output terminal is coupled to the gates of transistors 42 and 45. Latch circuit 49 latches the block selection signal SLCT. The output of latch circuit 49 is coupled to the gates of transistors 43 and 47. A fuse 50 and a resistance 51 are connected in series between main power line 3 and a ground terminal. The point of connection of fuse 50 and resistance 51 is coupled to the gates of transistors 44 and 46. The purpose of latch circuit 49 is as follows. When the block selection signal SLCT is low, control output terminal 52 becomes high and power is no longer supplied to the block, which would make the status of block selection signal SLCT indeterminate. It is therefore latched by latch circuit 49, in response to test control signal TEST, before this happens. The method of testing each block in succession according to this embodiment is as follows. Address data is used to select a circuit block. The block selection signal SLCT becomes high level for the selected block and low level for the remaining unselected blocks. Then, the test control signal TEST is made high level. N-type transistor 47 of the selected circuit block is now turned ON by the output of latch circuit 49, control output terminal 52 becomes low, and power is supplied to the selected block only. During testing, fuse 50 is in its unprogrammed state. N-type transistor 44 and P-type transistor 46, whose gates are supplied with power source voltage $V_{DD}$ (high level) via fuse 50, are respectively in their ON and OFF states. The selected block is subjected to various tests, a decision is made as to whether there are abnormal operating characteristics, and the decision data is stored. Next, the test control signal TEST is made low level, the N-type transistor 45 in each switch control circuit is turned ON, control output terminals 52 become low, and the initial state is recaptured, with power being supplied to all blocks. The operation is then repeated with a different circuit block being addressed, selected, and tested, until every circuit block has been tested. To turn OFF the switching transistor of a block having abnormal operating characteristics, fuse 50 in the corresponding switch control circuit is blown, supplying ground potential (low level) to the gate of P-type 46, making output control terminal 52 high level.

Figure 15:
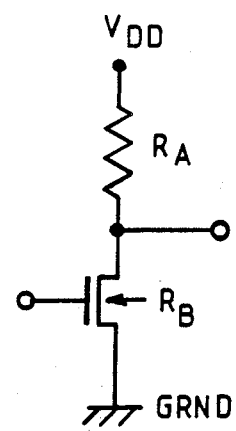
FIG. 15 is an equivalent circuit illustrating the operation of the embodiment in FIG. 8.

When the fuses are blown, the operation of the switch control circuits shown in FIGS. 8 and 10 is the same. The output terminals 27 and 52 are maintained at a high level through transistors 24 and 46, respectively. When the fuses are not blown, the circuit operation is different. FIG. 8 is a NOR circuit which is formed of N-type transistors 26, 41 and P-type transistor 24 serving as a load element. Transistor 24 is equivalent to a resistor R. The operation of this NOR circuit corresponds to that of an N-type inventer circuit shown in FIG. 15. In FIG. 15, the impedance RA of the load element should be larger than the impedance RB of the driven MOS transistor in order to obtain high and low level outputs.

Figure 4:
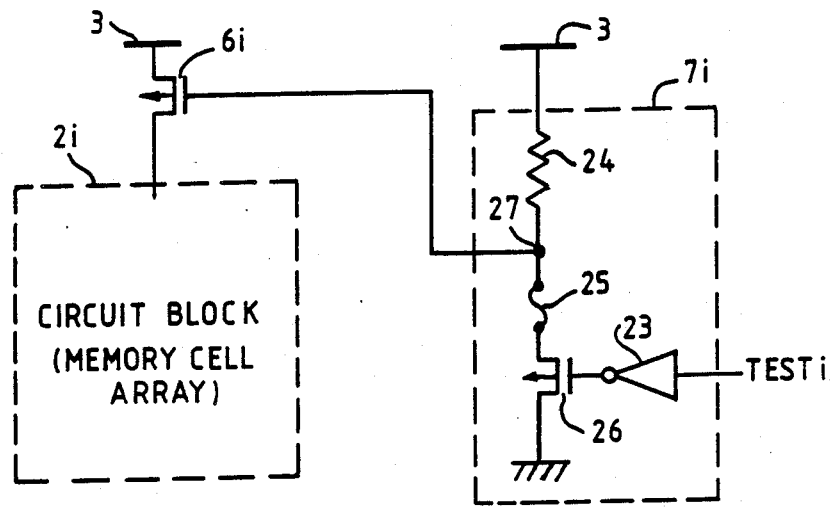
FIG. 4 is a circuit diagram of the switch circuit and switch control circuits of FIG. 3.
Figure 11:
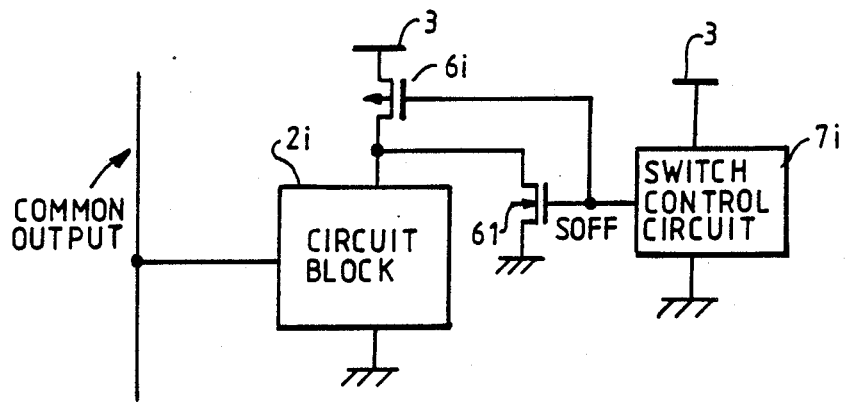
FIGS. 11, 12 and 13 are circuit diagrams of other embodiments of the invention.

In the embodiment shown in FIG. 4, when switching transistor $6_i$ turns OFF, the power source potential of block $2_i$ is indeterminant, i.e. it may not be at the ground potential. In an indeterminant state, the circuit block may output faulty data. To avoid this, an N-type transistor 61 may be coupled between the power source node of block $2_i$ and a ground terminal, as shown in FIG. 11. The output SOFF of switch control circuit $7_i$ is supplied to the gate of transistor 61. By this means, transistor 61 is turned ON when switching transistor $6_i$ goes OFF. This fixes the power source node of block $2_i$ to ground potential.

Figure 12:
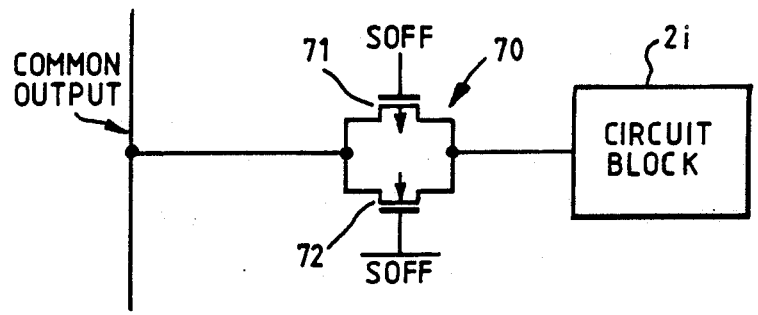

Again, when switching transistor $6_i$ is turned OFF, the potential of the output signal line of block $2_i$ becomes indeterminate, which is undesirable if the output line signal line is coupled in common to several blocks. To avoid this, a CMOS switch 70 (consisting of a P-type transistor 71 and an N-type transistor 72 connected in parallel) may be inserted in series in the output signal line between the circuit block and a common output line, as shown in FIG. 12, control being effected by the complementary outputs SOFF and $\overline{SOFF}$ of the switch control circuit.

Figure 13:
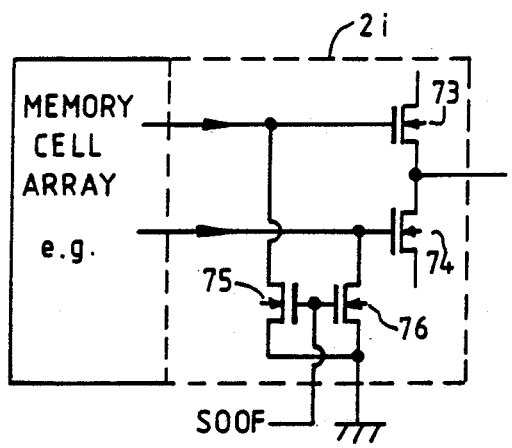

Alternatively, as shown in FIG. 13, control transistors 75 and 76 may be connected (for example) between the gates of N-type output transistors 73 and 74 of the circuit block and a ground terminal. By applying the output SOFF of the switch control circuit to the gates of transistors 75 and 76, transistors 75 and 76 are turned ON when output is OFF and the gate potentials of output transistors 73 and 74 are fixed at ground potential. The output OFF state is thus maintained.

Figure 14:
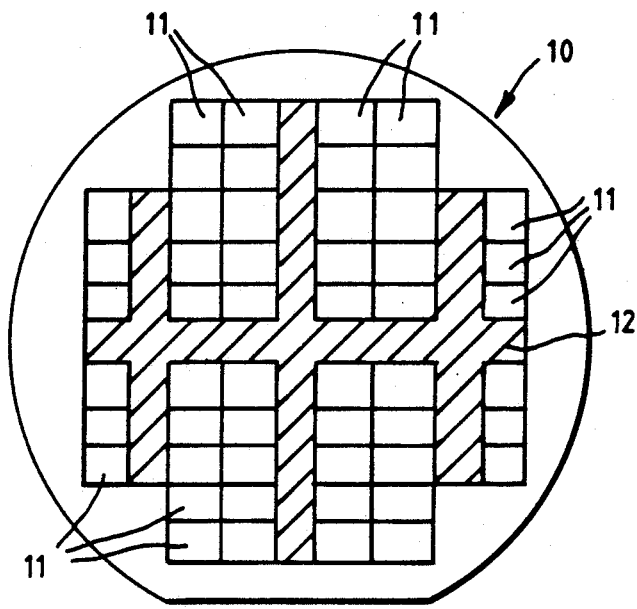
FIG. 14 is a block diagram of another embodiment of the present invention.

The invention is not restricted to the kind of LSI chip described above, but may also be applied to "full wafer" integrated circuits, in which several circuit blocks having equivalent functions are formed on a semiconductor wafer. A common main power line and main ground line are also formed on the wafer. The full memory wafer 10 shown in FIG. 14 is an example of this application. In FIG. 14, memory blocks 11 have equivalent memory functions. A main power line and main ground line are common to memory blocks 11 and formed in the areas denoted by 12.

With the semiconductor integrated circuit of the invention, as described above, a block with abnormal operating characteristics on an IC chip or a semiconductor wafer may be readily identified and put into an OFF state where it is electrically isolated from the main power and ground lines. This may be accomplished without difficulty and in a manner that is compatible with a high level of production and reliability, with the result that the yield of usable chips or wafers is substantially increased.

While the foregoing description is directed to only a few presently preferred embodiments it will be obvious to one of ordinary skill that numerous modifications may be made without departing from the true spirit or scope of the invention which is to be limited only by the appended claims.

We claim:

1. A semiconductor integrated circuit having power lines, the circuit comprising:
a plurality of circuit blocks each having equivalent functions;
first switch means corresponding to each circuit block for coupling power from said power lines to the corresponding circuit block; and
switch control means corresponding to each first switch means for selectively controlling the activation of the corresponding first switch means.

2. A semiconductor integrated circuit having power lines, the circuit comprising:
a plurality of circuit blocks each having equivalent functions;
first switch means corresponding to each circuit block for coupling power from said power lines to the corresponding circuit block;
switch control means corresponding to each first switch means for selectively controlling the activation of the corresponding first switch means; and
a block addressing means coupled to each of said plurality of circuit blocks to selectively address at least one of said circuit blocks.

3. The semiconductor integrated circuit according to clam 1 or 2 further comprising:
means for maintaining a circuit block at a fixed potential when the corresponding first switch means is not activated.

4. The semiconductor integrated circuit according to claim 3 wherein said fixed potential is the ground potential.

5. The semiconductor integrated circuit according to claim 1 or 2 further comprising:
second switch means coupled to the circuit block for impeding the flow of an output signal from the circuit block when the corresponding first switch means is not activated.

6. The semiconductor integrated circuit according to claim 5 wherein
said second switch means is a CMOS switch comprising a P-type transistor and an N-type transistor connected in parallel.

7. The semiconductor integrated circuit according to claim 1 or 2 further comprising:
at least one output transistor coupled to the circuit block; and
means for selectively controlling the gate potentials of said at least one output transistor so as to control the activation of said output transistor.

8. The semiconductor integrated circuit according to claim 1 or 2 wherein
the plurality of circuit blocks are memory blocks formed on a semiconductor wafer, the integrated circuit being a full wafer memory.

9. The semiconductor integrated circuit according to claim 1 or 2 wherein
said first switch means comprises a transistor.

10. The semiconductor integrated circuit according to claim 1 or 2 wherein
said switch control means comprises a programmable element.

11. The semiconductor integrated circuit according to claim 10 wherein
said programmable element is a fuse.

12. The semiconductor integrated circuit according to claim 11 wherein
said fuse may be blown by irradiation.

13. The semiconductor integrated circuit according to claim 3 wherein
said means for maintaining a circuit block at fixed potential comprises a transistor whose control gate is coupled to the corresponding switch control means and whose electrodes are coupled between the circuit block and a ground.

14. The semiconductor integrated circuit according to claim 1 or 2 wherein
each of said circuit blocks comprises a memory cell array.

15. The semiconductor integrated circuit according to claim 1 or 2 wherein
each of said circuit blocks comprises shift registers.

16. The semiconductor integrated circuit according to claim 1 or 2 wherein
each of said circuit blocks comprises a gate array.

17. The semiconductor integrated circuit according to claim 1 wherein
said switch control means includes a programmable element for selectively controlling the activation of the corresponding first switch means according to the logic level of a test control signal applied to said switch control means when said programmable element is in an unprogrammaed state.

18. The semiconductor integrated circuit according to claim 17 wherein
said switch control means further generated an output which deactivates the corresponding first switch means when the programmable element is in a programmed state.

19. The semiconductor integrated circuit according to claim 2 wherein
said switch control means includes a programmable element for selectively controlling the activation of the corresponding first switch means according to the logic level of a test control signal common to each switch control means and an address signal from said block addressing means which selectively addresses at least one of said circuit blocks when said programmable element is in an unprogrammed state.

20. The semiconductor integrated circuit according to claim 19 wherein
said switch control means further generates an output which deactivates the corresponding first switch means when the programmable element is in a programmed state.

21. The semiconductor integrated circuit according to claim 1 wherein said switch control means comprises:
a resistive element, a programmable element, and a transistor respectively coupled in series between said power lines, an inverted test signal being applied to the gate of said series-coupled transistor.

22. The semiconductor integrated circuit according to claim 21 wherein said first switch means is coupled to a point between said series-coupled resistive element and programmable element.

23. The semiconductor integrated circuit according to claim 2 wherein said switch control means comprises:
a resistive element, a programmable element, and an N-type and P-type transistor coupled in parallel, siad resistive element, programmable element, and parallel transistor combination being respectively coupled in series between said power lines, an inverted test signal common to each of said switch control means being applied to the gate of said N-type transistor coupled in parallel and a selection signal corresponding to an addressed circuit block being applied to said P-type transistor coupled in parallel.

24. The semiconductor integrated circuit according to claim 12 wherein said first switch means is coupled to a point between said series-coupled resistive element and programmable element.

25. The semiconductor integrated circuit according to claim 2 wherein said switch control means comprises:
- a programmable element and a resistive element respectively coupled in series between said power lines;
- a first and second P-type transistor and a first and second N-type transistor respectively coupled in series between said power lines;
- a third P-type transistor coupled in parallel with said first and second P-type transistor;
- a third N-type transistor coupled in parallel with said second N-type transistor;
- a latch circuit for latching a selection signal corresponding to an addressed circuit block, the output of said latch circuit being coupled to the gates of the second P-type transistor and the third N-type transistor, the selection signal being latched in response to a test signal common to each of said switch control means, the inverted test signal being applied to the gates of the first P-type transistor and the second N-type transistor, the control gates of said third P-type transistor and said first N-type transistor being coupled to a point between said series-coupled programmable element and resistive element.

26. The semiconductor integrated circuit according to claim 25 wherein said first switch means is coupled to a point between said series coupled second P-type transistor and first N-type transistor.

* * * * *